Aug. 31, 1965 J. J. HICKEY 3,204,130
FAST ACTING TIME DELAY UTILIZING REGENERATIVELY COUPLED TRANSISTORS
Filed Oct. 1, 1962

JOHN J. HICKEY
INVENTOR.
BY Jerry A. Dinardo
AGENT

United States Patent Office 3,204,130

Patented Aug. 31, 1965

3,204,130

FAST ACTING TIME DELAY UTILIZING REGENERATIVELY COUPLED TRANSISTORS

John J. Hickey, Hawthorne, Calif., assignor, by mesne assignments, to Thompson Ramo Wooldridge Inc., Cleveland, Ohio, a corporation of Ohio Filed Oct. 1, 1962, Ser. No. 227,401
6 Claims. (Cl. 307—88.5)

Figure 1:
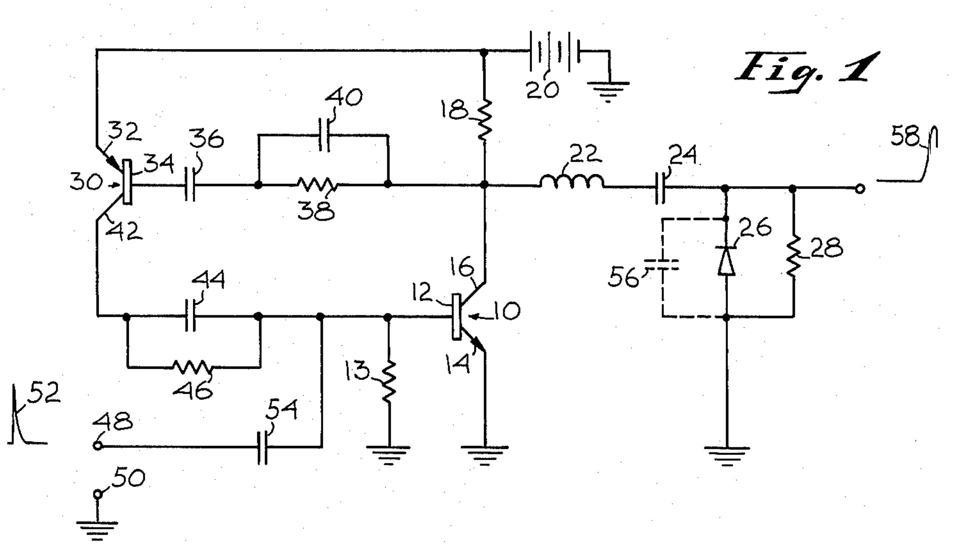

This invention relates generally to wave generating circuits and particularly to improvements in electronic time delay generators capable of generating time delays in the microsecond and submicrosecond regions.

It is often desired to make use of timing circuits in which a timing waveform is initiated only after a precise interval following the occurrence of a given event. When such circuits are used in ultra high speed photography, it is necessary that the time jitter or variation in time delay be maintained at a minimum in order to insure the correct timing of exposures.

One type of circuit for generating a time delay waveform utilizes a high-current-conducting thyratron as a switch to discharge a capacitor in a series resonant circuit. The time duration of the first half cycle of oscillatory current is a measure of the time delay. The employment of a thyratron in such a circuit requires the use of a large series charging resistor to cause the thyratron to deionize following the discharge of the capacitor. Accordingly, since a long time is required to recharge the capacitor through such a large resistance value before the next time delay waveform can be generated, the repetition rate of the time delay circuit is seriously limited.

Accordingly, an object of this invention is to increase the repetition rate of time delay circuits of the type described.

A further object is to reduce time jitter of a timing waveform.

The foregoing and other objects are realized according to the invention by employing a transistor switching circuit for controlling the discharge and recharging of a capacitor in a time delay circuit of the type referred to. Briefly, the time delay circuit includes a first transistor having an input circuit and an output circuit. A capacitor, an inductor, and a unidirectional current conducting device, or diode, are connected in series in the output circuit of the transistor to form a series resonant circuit through the latter when it conducts. A direct current voltage source and a resistor are also connected in series in the output circuit of the transistor to form a charging circuit for the capacitor when the transistor is nonconducting. A second transistor is arranged in a regenerative circuit with the first transistor. The output of the first transistor is coupled through a charging circuit to the input of the second transistor, and the output of the second transistor is coupled resistively to the input of the first transistor.

In the absence of a trigger pulse, both transistors are nonconducting and the capacitor in the resonant circuit is fully charged. A trigger pulse applied to the input of the first transistor causes current from the source to flow in one path through the output circuit of the first transistor and in a parallel path through the input circuit of the second transistor. Regenerative action between the two transistor circuits renders the first transistor output circuit heavily conducting so as to provide an oscillatory discharge of the capacitor of the resonant circuit. The oscillatory current during its first half cycle flows through the diode in its forward direction so that no appreciable voltage is developed across the diode during this time.

At the end of the first half cycle, the oscillatory current reverses direction and flows through the capacitance of the diode in the reverse direction at a higher frequency of oscillation. The current reversal gives rise to an output voltage across the diode, the delay in the occurrence of this voltage being determined by the original frequency and being representative of the desired delay.

The charging circuit between the input of the second transistor and the output of the first transistor controls the period of conduction of both transistors. The parameters of the charging circuit are chosen to cause conduction of both transistors to cease shortly after the generation of the delay pulse, whereupon the capacitor of the resonant circuit is permitted to recharge through the series resistor. The use of transistor circuitry permits a low resistance to be used for the series resistor, thereby allowing the capacitor to quickly recharge. The repetition rate of the delay circuit is thereby increased.

Figure 2:
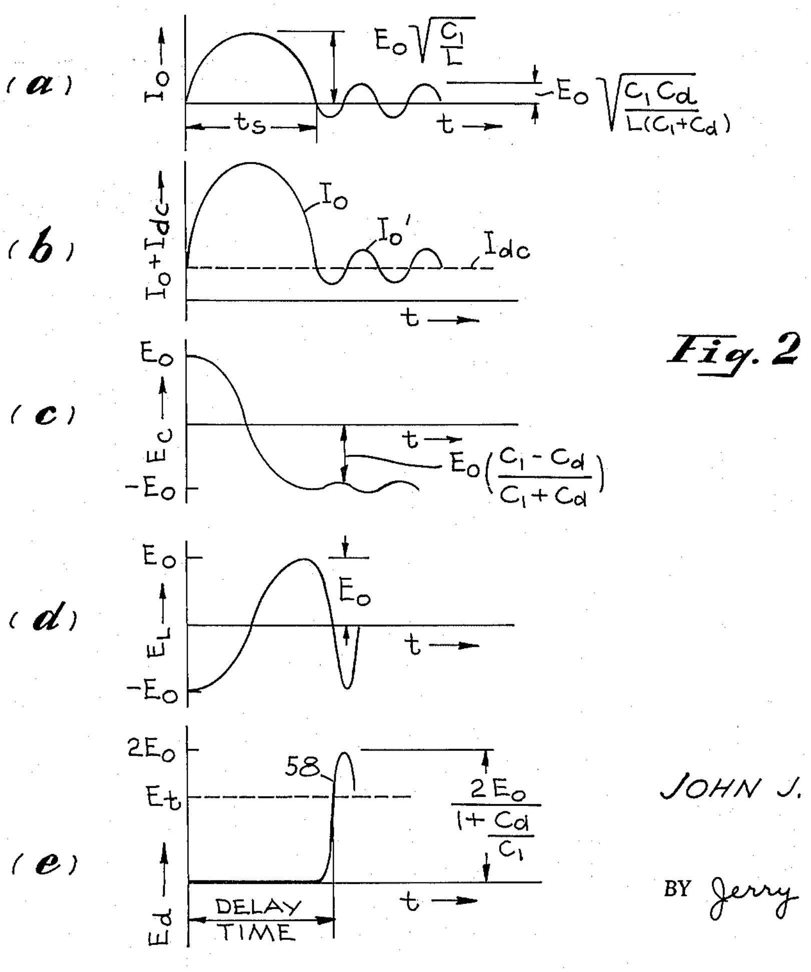

In the drawing:

FIG. 1 is a schematic diagram illustrating one form of delay circuit according to the invention; and FIG. 2 is a series of graphs of waveforms useful in explaining the operation of the delay circuit of of FIG. 1.

Referring to FIG. 1, the delay circuit illustrated includes a switching device or first transistor 10. The transistor 10 is illustrated as an n-p-n junction type transistor having a base 12 connected to ground through a resistor 13 and a grounded emitter 14. The collector 16 is connected through a current limiting resistor 18 to the positive side of a direct current voltage source 20, say of 10 volts.

The collector 16 is connected in series with an inductor 22, a capacitor 24, and a unidirectional current conducting device 26, such as a semiconductor diode. A load resistor 28 is connected across the diode 26.

A second transistor 30, illustrated as a p-n-p junction type, has its emitter 32 connected to the positive side of the source 20. The base 34 is coupled to the collector 16 of the first transistor 10 through a capacitor 36, a resistor 38, and a capacitor 40 in parallel with the resistor 38. The collector 42 is coupled to the base 12 of the first transistor 10 through a capacitor 44 in parallel with a current limiting resistor 46.

A pair of input terminals 48 and 50 are provided for receiving a positive input current pulse 52 and applying it through a capacitor 54 to the base 12 of the first transistor 10.

The transistors 10 and 30 are regeneratively coupled. Thus, an increase in the base-emitter current of the first transistor 10 will produce an increase in the collector-emitter current thereof, which is coupled to the emitter-base junction of the second transistor 30. The increased emitter-base current of the second transistor 30 causes an increase in the emitter-collector current thereof, which is coupled to the base-emitter junction of the first transistor 10, and the cycle is repeated until maximum currents are reached, as determined by the current limiting resistors 18 and 46.

The operation of the time delay circuit will now be described. In the absence of the trigger pulse 52, both transistors 10 and 30 are nonconducting. The capacitor 24 is charged to the voltage of the source 20 through the series charging circuit including the source 20, resistor 18, inductor 22, capacitor 24, and load resistor 28. Charging current does not flow through the diode 26 because the latter presents a high impedance in the direction of charging current flow.

When a positive input current pulse 52 of 1 milliampere having a duration of 10 nanoseconds is applied to the input terminals 48 and 50, it is coupled through the capacitor 54 to the base 12 of the first transistor 10, causing current to flow in the output circuit thereof. Assuming conventional current flow, a current flows in one path from the source 20 through the resistor 18 and from the collector 16 to the emitter 14. Current also flows in a second path from the source 20 through the emitter 32-base 34 junction of the second transistor 30, the capacitor 36, the parallel combination of the resistor 38 and capacitor 40, and through the collector 16 to the emitter 14 of the first transistor 10.

The current flowing through the emitter 32-base 34 junction of the second transistor 30 causes current to flow in the output thereof from the emitter 32 to the collector 42, through the resistor 46 and through the base 12-emitter 14 junction of the first transistor 10. Thus, current flows regeneratively through both transistors 10 and 30, whereupon the first transistor 10 is quickly caused to conduct heavily, bringing the collector 16 to within a few tenths of a volt of zero potential in a matter of a few nanoseconds. In this connection, it is noted that capacitors 40 and 44 are of small capacitance values to cause the base capacitances of the transistors to charge rapidly and thereby hasten the switching of the transistors.

The steady direct current $I_{dc}$ flowing from the collector 16 to the emitter 14 when the first transistor 10 reaches full conduction is approximately equal to the voltage of the source 20 divided by the resistance of the resistor 18.

When conduction is established through the collector 16 to the emitter 14 of the first transistor, a path is provided therethrough for the oscillatory discharge of the capacitor 24. Oscillatory current $I_0$ flows in the resonant circuit including the capacitor 24, the inductor 22, the collector 16 and emitter 14 of the first transistor 10 and the diode 26 in its forward direction.

Furthermore, when the transistor 10 reaches full conduction, the current flowing in the path including the emitter 32-base 34 junction of the second transistor 30, the capacitor 36 and resistor 38 charges the capacitor 36, the current decreasing exponentially at a rate determined by the time constant of the capacitor 36 and the resistor 38. As will be explained later, when this current reaches a sufficiently low value, it will cause both transistors 30 and 10 to switch to the nonconducting state and cut off the steady direct current $I_{dc}$.

Reference is now made to the graphs of FIG. 2 which depict the current and voltage waveforms associated with the various circuit elements. Graph 2(*a*) illustrates the oscillatory current $I_0$ flowing in the oscillatory circuit. Graph 2(*b*) illustrates the composite direct current $I_{dc}$ and oscillatory current $I_0$ flowing through the collector-emitter junction of the transistor 10; graph 2(*c*) illustrates the voltage across the capacitor 24. Graph 2(*d*) illustrates the voltage across the inductor 22. Graph 2(*e*) illustrates the output voltage across the diode 26.

It is seen in graph 2(*a*) that during the first half cycle of current flow, the oscillatory current $I_0$ varies at a sinusoidal rate that is determined by the circuit parameters, namely, the inductance of the inductor 22 and the capacitance of the capacitor 24. The current $I_0$ can be expressed by the following equation, $$I_0(t)=\frac{E_0}{\omega_1 L}\sin\omega_1 t$$

where $E_0$ is the voltage of the source 20, L is the inductance of inductor 22, and $$\omega_1=\sqrt{\frac{1}{LC_1}}$$

where $C_1$ is the capacitance of the capacitor 24 and $\omega_1$ is the angular frequency in radians per second.

The maximum values of the voltages $E_c$ and $E_L$ are equal to the source voltage $E_0$, and the voltages $E_c$ and $E_L$ are at all times equal and opposite to each other. While the diode 26 is conducting, its impedance is almost zero, and hence no appreciable voltage is developed thereacross as shown in graph 2(*e*).

It is noted in graph 2(*b*) that the current from the collector to the emitter of the transistor 10 has two components, namely the oscillatory current $I_0$ and the direct current $I_{dc}$. The direct current $I_{dc}$ is of constant amplitude and is of sufficient magnitude, as determined by the resistance value of resistor 18, to maintain the transistor 10 conducting between the collector 16 and emitter 14 when the oscillatory current $I_0$ reverses direction. Since the transistor 10 can conduct current only in one direction, it can not conduct the oscillatory current $I_0$ when the latter is present alone during a negative excursion, but will conduct such current when it is superimposed on a greater positive current, such as the direct current $I_{dc}$.

At the end of the first half cycle of oscillation, the capacitor 24 is fully charged with a polarity opposite to its original polarity, as shown in graph 2(*c*), and has a tendency to reverse the direction of the oscillatory current $I_0$. Since the diode 26 will not conduct current in the reverse direction, it presents a high reactive impedance, in the form of a low diode capacitance 54, shown in phantom in FIG. 1. The circuit parameters now are composed of the capacitor 24, the inductor 22, and the diode capacitance 54, which preferably has a very small magnitude as compared with the capacitor 24. Since the diode capacitance 54 is much smaller than that of the capacitor 24, the frequency of oscillation will now be controlled primarily by the diode capacitance. Accordingly, the frequency will increase to a value $\omega_2$ determined by the following expression, $$\omega_2=\frac{1}{\sqrt{L\left(\frac{C_1\times C_d}{C_1+C_d}\right)}}$$

where $C_d$ is the capacitance of the diode 26.

Assuming that the diode capacitance 54 is $\frac{1}{15}$ that of the main capacitor 38 the higher frequency $\omega_2$ will be four times that of the original frequency $\omega_1$. The higher frequency current $I_0'$, shown in the right half portion of graph 2(*a*), is given by the following expression, $$I_0(t)=\frac{E_0}{\omega_2 L}\sin\omega_2(t-t_s)$$

where $t_s$ is the time at which the diode 26 stops conducting. Under the higher frequency oscillating conditions, the capacitor 24 acts as a substantially constant voltage source of magnitude approximately $-E_0$, with a small ripple or variation due to its small internal reactance, superimposed on the constant voltage, as shown in graph 2(*c*). The capacitor voltage $E_c$ drives the inductor 22 and the diode capacitance 54 into oscillation, the voltage $E_d$ across the diode 26 being substantially equal and opposite to the sum of the voltage $E_L$ across the inductance 22 and the voltage $E_c$, as shown in FIG. 2. The maximum voltage across the diode 26 is equal to $$\frac{2E_0}{1+C_d/C_1}$$

It is seen that when $C_1=15C_d$, the maximum diode voltage $E_d$ is slightly less than $2E_0$, the peak voltage $E_L$ across the inductance 22 is $E_0$, and the voltage $E_c$ across the capacitor 24 is the negative of the sum of the two voltages $E_L$ and $E_d$.

The voltage $E_d$ across the diode 26 constitutes the output voltage of the delay circuit. It is seen from graph 2(*e*) that the output pulse 58 is delayed in time by at least one half period of the lower oscillation frequency $\omega_1$, the exact amount of the delay depending upon the time required for the diode 26 voltage to reach a certain useful threshold voltage $E_t$, shown as a dashed line in graph 2(*e*).

It is noted that the time delay of the output pulse 58 is determined primarily by the inductance and capacitance of the inductor 22 and capacitor 24, respectively. The time for the diode voltage $E_d$ to rise to the threshold value $E_t$ is determined by the ratio of the capacitances of the capacitor 24 and the diode 26. For example, if the diode capacitance is made smaller, the higher oscillation frequency $\omega_2$ will be greater, thereby producing a steeper wavefront on the output voltage pulse 58, and decreasing the time required to reach the threshold voltage $E_t$.

As described previously, upon switching of the first transistor 10 to the conducting state, an exponentially decreasing current was caused to flow in the branch including the emitter 32-base 34 junction of the second transistor 30, the capacitor 36 and the resistor 38. As long as this current, which supplies the input to the second transistor 30, is sufficiently high, the emitter 32-collector 42 output current of the second transistor will be maintained at a maximum constant value determined by the values of the supply voltage of the source 20 and the resistance of the resistor 46.

When the current input of the second transistor 30 drops to a value that is insufficient to maintain the maximum output current of the second transistor 30, the emitter 32-collector 42 output current drops. Since the output current of the second transistor 30 supplies the input current to the first transistor 10 between the base 12 and emitter 14 thereof, the collector 16-emitter 14 output current of the first transistor will drop also, causing the input current of the second transistor 30 to drop still further. The cycle is repeated until both transistors 10 and 30 no longer conduct.

When the first transistor 10 stops conducting it presents a high impedance to the high frequency oscillatory current $I_0'$ and the resonant circuit stops oscillating. The capacitor 24 of the resonant circuit then recharges through the charging resistor 18 and load resistor 28 to establish the conditions necessary for receiving the next input trigger pulse 52.

The RC time constant of the circuit including the capacitor 36 and resistor 38 is designed to maintain the first transistor 10 conducting slightly longer than a half period of the low frequency oscillatory current $I_0$ and at least long enough to produce the output delay pulse. Preferably, the RC time constant is designed so that the first transistor 10 will be turned off immediately after the delay pulse is produced, in order to achieve a high repetition rate.

In comparing the circuit of the present invention with prior art circuits utilizing thyratrons, it is noted that thyratron circuits require the use of a large series charging resistor in order to cause the thyratron tube to deionize after the production of the delay pulse. Accordingly, a long time is required to recharge the capacitor in the resonant circuit, thereby imposing a limitation on the repetition rate. The deionization time of the thyratron itself also limits the repetition rate. Both of these factors limit the repetition rate to a value that is approximately $$\frac{1}{T_0 \times 1000}$$

pulses per second, where $T_0$ is the time delay.

The foregoing objections are overcome in the present invention by employing a controllable RC charging circuit in the input circuit of the second transistor 30 which causes the first transistor 10 to be turned off within a time, after the output pulse is produced, that is a fraction of the delay time. Transistor circuitry permits the use of a much smaller charging resistor 18 to enable the capacitor 24 to recharge quickly. The repetition rate is increased by a factor of at least 30. Other advantages of the invention are that the switching on time of transistors is about 5 nanoseconds as compared with 20 nanoseconds for thyratrons, and the time jitter of the output delay pulse is less by a factor of 10.

The delay circuit of the invention was operated successfully with the following circuit values:

| | |
|---|---|
| Transistor **10** | Type 2N706. |
| Resistor **13** | 1 megohm. |
| Resistor **18** | 10 kilohms. |
| Source **20** | 10 volts D.C. |
| Inductor **22** | 100 microhenries. |
| Capacitor **24** | 1000 micromicrofarads. |
| Diode **26** | Type 1N914. |
| Resistor **28** | 10 kilohms. |
| Transistor **30** | Type 2N1195. |
| Capacitor **36** | 2000 micromicrofarads. |
| Resistor **38** | 100 kilohms. |
| Capacitor **40** | 5 micromicrofarads. |
| Capacitor **44** | 10 micromicrofarads. |
| Resistor **46** | 1 kilohm. |
| Capacitor **54** | 50 micromicrofarads. |

The embodiments of the invention in which an exclusive property or privilege is claimed are defined as follows:

1. A time delay circuit, comprising:
   - a transistor having an input circuit and an output circuit;
   - a first circuit including an inductor, a capacitor, and a unidirectional current conducting device connected in series in the output circuit of said transistor, said capacitor and said inductor being series resonant at a predetermined frequency;
   - a second circuit including a unidirectional current source and a resistor connected in series in the output circuit of said transistor;
   - circuit means connected to initially prevent current flow in the output circuit of said transistor;
   - and circuit means connected to apply a trigger pulse to the input circuit of said transistor and to cause current to flow in the output circuit thereof for a time only slightly greater than the half period of said predetermined frequency.

2. A time delay circuit according to claim 1, wherein said transistor is regeneratively coupled to a second transistor.

3. A time delay circuit according to claim 2, wherein said transistor is an n-p-n junction type and said second transistor is a p-n-p junction type.

4. A time delay circuit according to claim 2, and further including a series resistor-capacitor network coupled between the output of said transistor and the input of said second transistor.

5. A time delay circuit according to claim 4, wherein the parameters of said resistor-capacitor network are chosen to cause said transistor to conduct only for a short time greater than the half period of said predetermined frequency.

6. A time delay circuit, comprising:
   - a first transistor having base, collector, and emitter electrodes;
   - a first circuit connected in series across said collector and emitter and including an inductor, a capacitor, and a diode in series and a resistor in parallel with said diode, said inductor and said capacitor being resonant at a predetermined frequency;
   - a second circuit connected in series across said collector and emitter and including a direct current voltage source and a series resistor;

a second transistor having base, collector, and emitter electrodes;

a capacitor and a resistor connected in series between the base of said second transistor and the collector of said first transistor and forming a charging network;

a resistor connected between the collector of said second transistor and the base of said first transistor;

and circuit means for coupling an input pulse to the base of said first transistor to render the same conducting;

the time constant of said charging network being selected to maintain said first transistor conducting for a time that is only slightly greater than the half period of said predetermined frequency.

References Cited by the Examiner

UNITED STATES PATENTS

| | | | |
|---|---|---|---|
| 2,878,382 | 3/59 | Creveling | 328—223 |
| 2,891,155 | 6/59 | Carr | 328—67 |
| 3,103,595 | 9/63 | Logue | 307—88.5 |

ARTHUR GAUSS, *Primary Examiner.*